(12) United States Patent
Shimomura et al.

(10) Patent No.: US 11,355,201 B2
(45) Date of Patent: Jun. 7, 2022

(54) LEAKAGE REDUCTION CIRCUIT FOR READ-ONLY MEMORY (ROM) STRUCTURES

(71) Applicant: SanDisk Technologies LLC, Addison, TX (US)

(72) Inventors: Shigeki Shimomura, Cupertino, CA (US); Henry Zhang, Saratoga, CA (US); Ryuji Yamashita, Inagi (JP); Minh Nguyen, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/904,983

(22) Filed: Jun. 18, 2020

(65) Prior Publication Data

US 2021/0398594 A1    Dec. 23, 2021

(51) Int. Cl.
| | | |
|---|---|---|
| *G11C 7/12* | (2006.01) | |
| *G11C 16/24* | (2006.01) | |
| *G11C 16/04* | (2006.01) | |
| *G11C 16/30* | (2006.01) | |
| *G11C 16/08* | (2006.01) | |
| *G11C 17/12* | (2006.01) | |

(52) U.S. Cl.
CPC ............ *G11C 16/24* (2013.01); *G11C 7/12* (2013.01); *G11C 16/0491* (2013.01); *G11C 16/08* (2013.01); *G11C 16/30* (2013.01); *G11C 17/12* (2013.01)

(58) Field of Classification Search
CPC ...... G11C 16/24; G11C 16/08; G11C 16/0491; G11C 16/30; G11C 7/12; G11C 17/12; G11C 16/26
See application file for complete search history.

(56) References Cited

U.S. PATENT DOCUMENTS

| | | | |
|---|---|---|---|
| 2007/0195574 A1* | 8/2007 | Mabuchi | G11C 17/12 365/94 |
| 2014/0241061 A1* | 8/2014 | Roy | G11C 17/12 365/185.16 |

* cited by examiner

*Primary Examiner* — Jay W. Radke
(74) *Attorney, Agent, or Firm* — Dickinson Wright PLLC; Steven C. Hurles (57) ABSTRACT

A method for performing a read operation of a memory block of a read-only memory array, wherein the method comprises first enabling bit line precharge circuitry of the memory block, (thereby precharging one or more bit lines of the memory block to a first voltage level), enabling a word line of one or more addressed memory cells of the memory block, enabling a leakage current reduction circuit of the memory block, thereby generating across the addressed memory cells a first voltage differential equal to the first voltage level; subsequently discharging the addressed memory cells; disabling the word line of the one or more addressed memory cells; disabling the bit line precharge circuitry; and disabling the leakage current reduction circuit, thereby generating across the one or more addressed memory cells a second voltage differential that is equal to less than the first voltage differential.

17 Claims, 7 Drawing Sheets

LEAKAGE REDUCTION CIRCUIT FOR READ-ONLY MEMORY (ROM) STRUCTURES

TECHNICAL FIELD

This disclosure relates to read-only memory (ROM) storage structures present in microcontrollers and other devices. More specifically, this disclosure relates to systems and methods for reducing a leakage current of a ROM storage structure occurring during an idle or static condition of the ROM structure.

BACKGROUND

Read-only memory (ROM) is a category of memory devices that may be pre-programmed with data during its fabrication, but this data is only read and not changed during normal memory operations. Accordingly, read-only memory is typically used to store master-level data that includes, but is not limited to, program code (or executable instructions) and other data (e.g., memory operation parameters) by which its resident microcontroller controls and operates a computing device.

As described in detail below, a read-only memory device may comprise one or more memory arrays of individual memory cells. Typically, a read-only memory (ROM) cell comprises a single transistor (e.g., an NMOS transistor) that is connected to a bit line of the array at its drain region and directly to ground at its source region. As a result of this single transistor cell configuration, a ROM cell is the smallest type of memory structure and, therefore, is characterized as having relatively fast data access speed/performance at low power while requiring a minimal amount of space on a chip. Further, the ROM structure's relatively straightforward fabrication and manufacturing process produces large yields. However, this seemingly simple memory structure configuration inherently produces its own very distinct challenges and behaviors. For example, due to the memory cell transistor's direct connection to ground, application of a voltage bias at the bit line during, for example, an idle condition in-between read memory operations in which the bit line is pre-charged, creates a large voltage difference across the transistor that, in some circumstances, results in a static current draw developing thru one or more of the memory cells of the memory array even while the memory device is not being read.

Such a leakage current represents a parasitic power loss in the memory device. Hence, there is a particular need for a circuit mechanism that can reduce or substantially eliminate this type of leakage current while maintaining the scale, performance, and efficiency of the ROM memory structure.

SUMMARY

Various embodiments include a method for performing a read operation of a memory block of a read-only memory array, wherein the method comprises enabling a bit line precharge circuit of the memory block, thereby precharging one or more bit lines of the memory block to a first voltage level; enabling a word line of one or more addressed memory cells of the memory block; also enabling a leakage current reduction circuit of the memory block, thereby generating across the one or more addressed memory cells a first voltage differential equal to the first voltage level; discharging the one or more bit lines associated with the one or more addressed memory cells; disabling the word line of the one or more addressed memory cells; and also disabling the leakage current reduction circuit, thereby generating across the one or more addressed memory cells a second voltage differential that is less than the first voltage differential.

Other embodiments include a memory controller comprising a first port configured to couple to a read-only memory array, wherein the memory array comprises at least one memory block having a plurality of memory cells and, during a read operation, the memory controller is configured to enable a bit line precharge circuit of the memory block to: precharge one or more bit lines of the memory block to a first voltage level; enable a word line of one or more addressed memory cells of the plurality of memory cells; enable a leakage current reduction circuit of the memory block, thereby generating across the one or more addressed memory cells a first voltage differential that is equal to the first voltage level; discharge the one or more bit lines associated with the one or more addressed memory cells; disable the word line of the one or more addressed memory cells; disable the bit line precharge circuitry; and also disable the leakage current reduction circuit, thereby generating across the one or more addressed memory cells a second voltage differential that is less than the first voltage differential.

Additional embodiments include a read-only memory system configured to reduce a leakage current thereof, wherein the system comprises a memory array storing data and comprising at least one memory block having a plurality of memory cells, and the system comprises a controller coupled to the memory array and, during a read operation, is configured to: enable a bit line precharge circuit of the memory block to precharge one or more bit lines of the memory block to a first voltage level; also enable a word line of one or more addressed memory cells of the plurality of memory cells; also enable a leakage current reduction circuit of the memory block, thereby generating across the one or more addressed memory cells a first voltage differential that is equal to the first voltage level; discharge the one or more bit lines associated with the one or more addressed memory cells; disable the word line of the one or more addressed memory cells; and disable the leakage current reduction circuit, thereby generating across the one or more addressed memory cells a second voltage differential less than the first voltage differential.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may comprise any tangible, physical, and non-transitory device. For example, a component may be in the form of a hardware logic circuit that comprises customized VLSI circuits, gate arrays, or other integrated circuits, or comprises off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may comprise one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Figure 1:
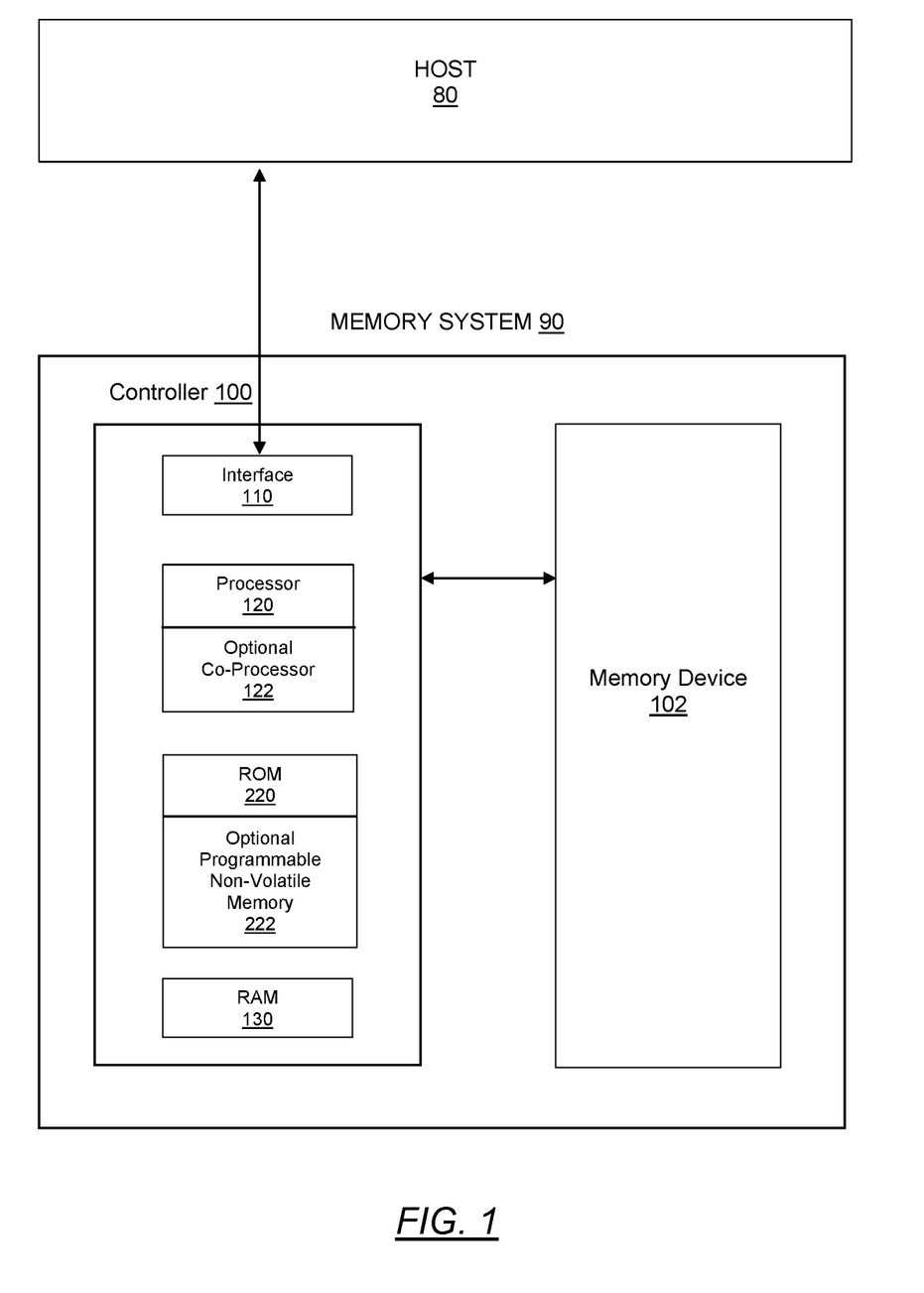
FIG. 1 is a block diagram of a memory system, in accordance with exemplary embodiments.

Referring now to the drawings in detail and beginning with FIG. 1, there is depicted an exemplary embodiment of a memory system 90 and is an illustration of its main hardware components. Memory system 90 is just one possible illustration of an environment in which a ROM device may be incorporated. ROM devices are utilized in a wide range of computing implementations and are oftentimes associated with the microcontroller (MCU) components of many types of computing, consumer electronic, and stand-alone external storage devices. With respect to this particular embodiment, the memory system 90 operates and is in communication with a host device 80 through a host interface. Further, the memory system 90 comprises a memory device 102 whose operations are controlled by a controller 100. Host device 80 may comprise any device or system that utilizes memory system 90 (e.g., a computing device). Accordingly, the memory system 90 may be in the form of a removable memory card or an embedded memory system. For example, the memory system 90 may be embedded in a solid-state drive installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, the memory device 102 of the exemplary system 90 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 220, RAM (random access memory) 130, programmable non-volatile memory 222, and additional components. The controller 100 may, for example, be in the form of one or more application-specific integrated circuits (ASIC) in which the components included in such an ASIC generally depend on the particular application.

Figures 2, 3:
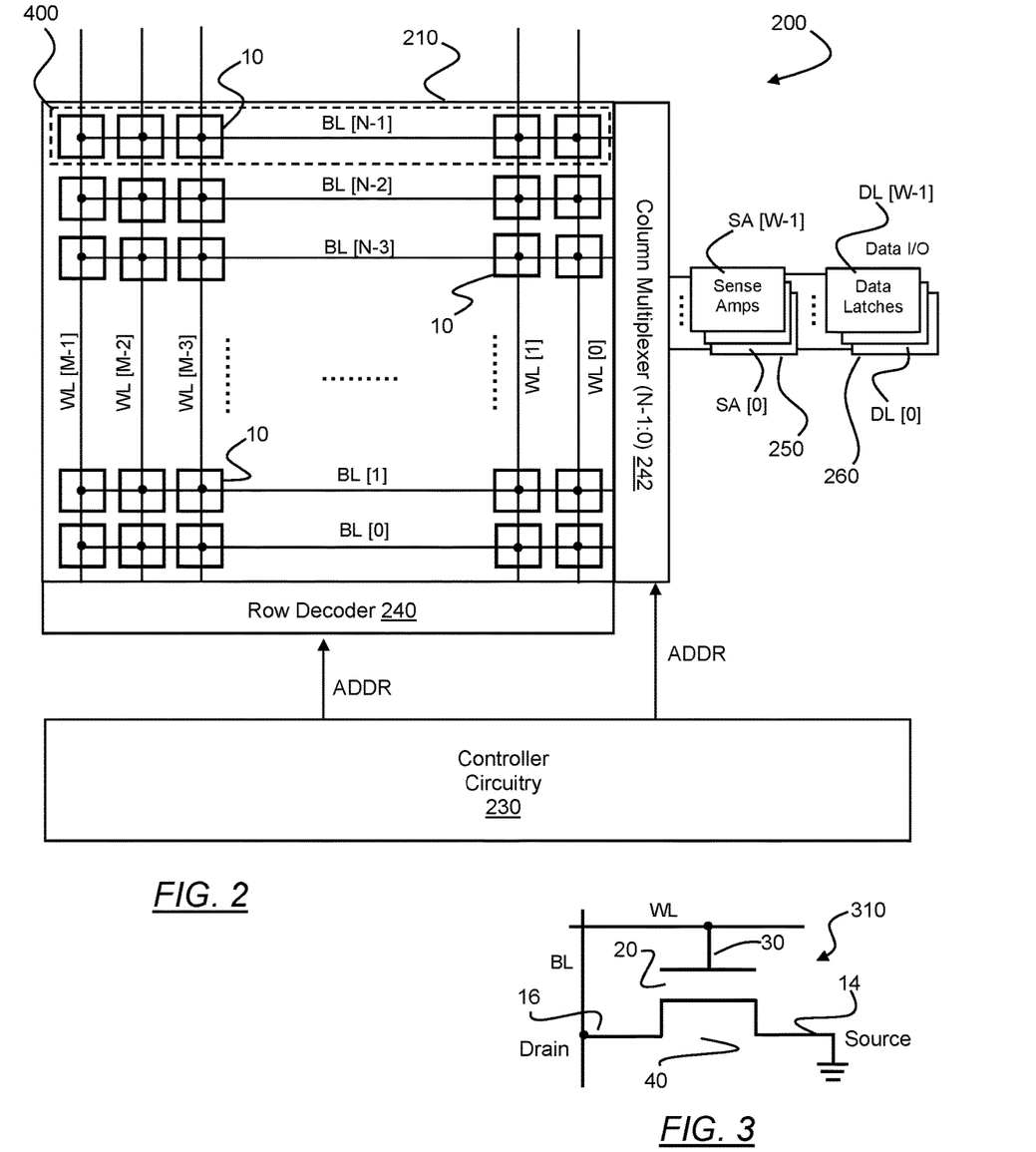
FIG. 2 is a block diagram of a memory block structure of a "W"-bit ROM array, in accordance with exemplary embodiments.
FIG. 3 schematically depicts an NMOS transistor of a ROM cell, in accordance with exemplary embodiments.

FIG. 2 depicts a general structure of a ROM device 200 (such as ROM 220 of the controller 100 of the exemplary embodiment illustrated in FIG. 1). ROM 200 may comprise one or more memory arrays, with each array comprising one or more memory blocks 210 of memory cells 10 that were pre-programmed during their fabrication. In precise terms, FIG. 2 depicts a block diagram of a single memory block 210 that corresponds to a single interface bit and, in conjunction with one or more additional memory blocks, forms a "W"-bit data interface ROM array (wherein "W" is any integer greater than "0"). Further depicted in FIG. 2 is the associated control circuitry 230, sense amplifier circuitry 250, and data output latch(es) 260 of memory block 210.

As depicted, the memory block 210 is accessible by way of a row decoder 240 and a column decoder 242, wherein the individual memory cells 10 of the memory block 210 are addressable via a selected word line and bit line. Accordingly, row decoder 240 selects one or more word lines and the column decoder 242 selects one or more bit lines in order to apply an appropriate voltage to the respective gates of the addressed memory cells 10, as is described in greater detail below. In operation, during a read or verify memory step, a respective sense amplifier 250 determines the current that is flowing through the drain region of an addressed memory cell 10 that is connected via the selected bit line. The current conduction level that is detected by the sense amplifier 250 is then converted into a set of data bits that is stored in a respective data latch 260, according to a level-to-bits conversion logic. As shown in FIG. 2, the memory block 210 according to this particular embodiment comprises an intersecting network of an "M"-number of word lines (i.e., WL[M−1] to WL[0]) (wherein "M" is any integer greater than "0") and an "N"-number of bit lines (i.e., BL[N−1] to BL[0]) (wherein "N" is any integer greater than "0").

As mentioned above, each ROM cell 10 resides at the intersection of a word line and a bit line and within each cell 10, there may exist a single transistor (e.g., an NMOS or PMOS transistor). FIG. 3 is a schematic representation of an exemplary embodiment of an individual transistor 310 according to a standard ROM cell configuration. As shown, the memory cell 10 may be implemented by a field-effect transistor 310 having a charge storage unit 20, such as a floating gate or dielectric layer, positioned above and isolated from a channel region 40 of a semiconductor substrate. Further, terminals of the transistor 310 comprise a source region 14 and a drain region 16. In the case of an NMOS transistor for example, the substrate is a "p-type" substrate and the source region 14 and the drain region 16 are of an "n-type." Further, a control gate 30 is positioned over and isolated from charge storage unit 20, wherein a threshold voltage ($V_{th}$) of the transistor is controlled by and dependent upon the amount of charge retained on the charge storage unit 20. Specifically, in a switch-like manner, a minimum amount of voltage (i.e., the threshold voltage) that must be applied to the control gate 30 before the transistor 310 is activated to permit electrical conduction between its source and drain regions is, therefore, determined by the level of charge retained on the charge storage unit 20. In the example of an NMOS transistor, application of the transistor-specific threshold voltage at the control gate will induce negative charges on the substrate surface (creating an inversion layer, or "n-channel"), thereby creating a conduction path between the source and drain regions. Based upon this principle, in order to perform a read operation, a voltage is placed on the control gate 30 of the memory cell 10 and, depending upon the programmed threshold voltage of the transistor 310, a current is or is not conducted by the transistor 310, which is sensed by a sense amplifier region 250 of the memory array 200 and is then converted into bit-level data (e.g., a "0" or "1") based upon the sensed current or the lack thereof.

Referring still to FIG. 3, it specifically depicts, as mentioned above, the ROM-type configuration of memory cell 10 occupied by a transistor 310, in which the drain region 16 is connected to a local bit line (BL), the control gate 30 is connected to a local word line (WL), and the source region 14 is connected to ground.

Figure 4A:
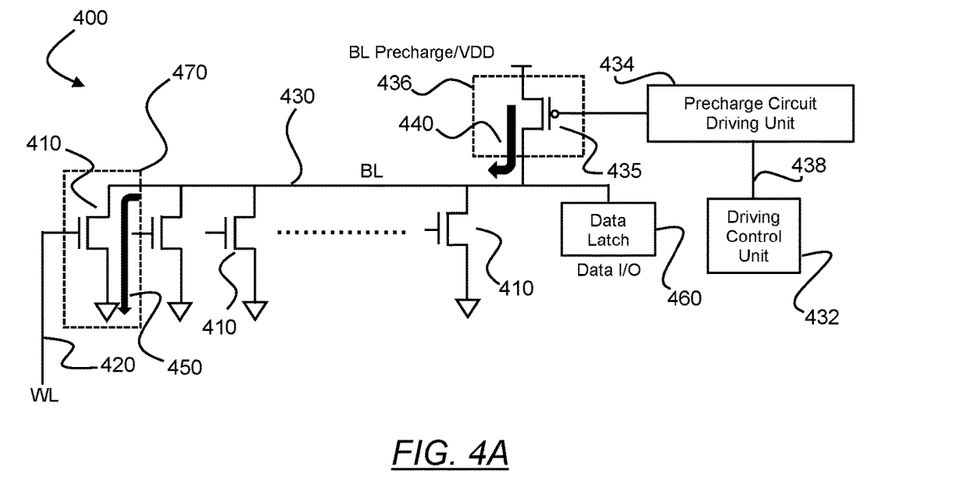
FIG. 4A is a block diagram of a circuit topology of a representative column of a ROM block, such as the memory block that is depicted in FIG. 2, in accordance with exemplary embodiments.

Referring now to FIG. 4A, there is depicted a detailed illustration of a representative column 400 of a ROM memory block, such as memory block 210 of FIG. 2, according to an exemplary embodiment thereof. This view is particularly useful in visualizing the conduction current path and the resulting voltage disparities across the memory structure as a result of the ROM configuration. As described above, column 400 generally comprises one or more memory cells, with each cell being either empty or comprising an individual transistor 410 connected to a common bit line (BL) 430 at its drain region and directly to ground (VSS) at its source region, according to the programmed connectivity during the device fabrication. In addition, the control gate of each transistor 410 of column 400 is connected to a respective word line (WL), such as word line 420. In this particular illustration, the column select device (e.g., a decoder or multiplexer, such as column multiplexer 242 of the embodiment shown in FIG. 2) and a respective sense amplifier region (SA) are omitted for purposes of clarity and simplicity. Accordingly, based upon this circuit configuration, column 400 is enabled by any one of the control gates of the individual transistors 410.

Importantly, also depicted in FIG. 4A is a bit line precharge circuit that comprises in part, for example, a PMOS transistor 435 connected to the bit line (BL) 430 and the respective data latch 460 of column 400. The function of the precharge circuit is to bring the respective bit line (BL) to a "HIGH" state ("VDD") relative to ground ("VSS") in order that the bit line (BL) may be discharged during a read operation in the manner described above. In general terms, a bit line precharge circuit may, according to certain exemplary embodiments, comprise several distinct components that include, for example, a driving control unit 432 connected to a precharge circuit driving unit 434, wherein the precharge circuit driving unit 434 is connected to a bit line precharge unit 436, such as the PMOS transistor 435 of the circuit shown in FIG. 4A. In such a system, the driving control unit 432 may receive a bit line precharge enable signal 438 as an input and, in response thereto, output to the precharge circuit driving unit 434 a driving signal of a power supply voltage level, referenced as VDD. In response to this driving signal, the bit line precharge unit 436 proceeds to precharge the corresponding bit line(s) (BL) at the indicated voltage level, VDD, in accordance with the driving signal. Consequently, a conduction current 440 begins to flow across the individual transistors 410 connected to the particular bit line 430 of the memory column 400 as according to the voltage differential of VDD>VSS.

Figure 4B:
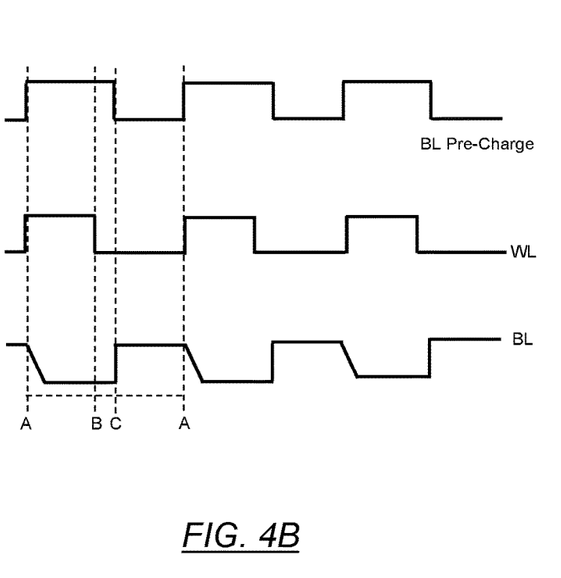
FIG. 4B is a timing diagram showing a basic read operation as applied to the representative ROM column that is depicted in FIG. 4A, in accordance with exemplary embodiments.

Depicted in FIG. 4B is a timing diagram of the several signals that may occur during a portion of a basic read operation of, for example, memory column 400 shown in FIG. 4A, in accordance with an exemplary embodiment. Accordingly, the waveforms depicted in FIG. 4B provide a general overview of the relationship between the bit line precharge and the word line enable signals, and their effect on the bit line operation, during a basic read operation. Further, FIG. 4C correspondingly illustrates in a flowchart manner the general steps of the basic read operation in correlation with the timing diagram of FIG. 4B.

Figure 4C:
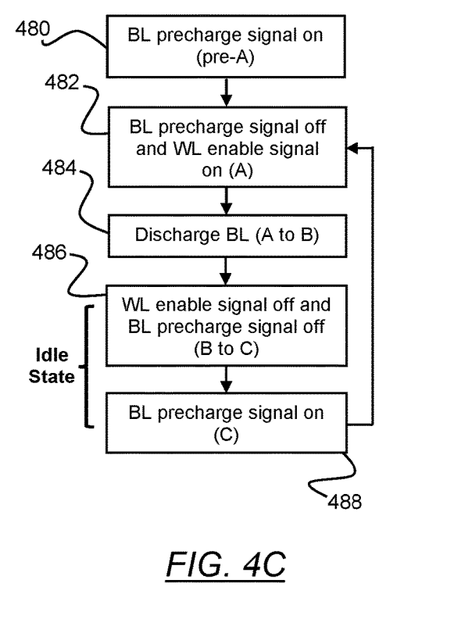
FIG. 4C is a flow diagram generally illustrating the steps of a basic read operation as applied to the representative memory column that is depicted in FIG. 4A, in accordance with exemplary embodiments.

As described above with respect to one exemplary embodiment of the basic read operation of a ROM array, the bit line precharge enable signal 438 is turned to an "ON" state, wherein the PMOS transistor 435 is enabled "LOW" (i.e., is a low voltage PMOS transistor operating according to an active low) (see step 480 in FIG. 4C). Consequently, the bit line (BL) signal is brought to a high voltage level, VDD. Next, as depicted at point "A" in FIG. 4B, the word line (WL) enable signal 420 of the addressed memory cell(s) is then switched to an "ON" state and the bit line precharge enable signal 438 is disabled (see step 482 in FIG. 4C). Accordingly, as a result, the addressed bit line (BL) is discharged and, as detailed above, the corresponding conduction current level through the transistor(s) 410 of the addressed memory cell(s) is sensed and, according to programmed logic, is converted into bit-level data that is transferred to a respective data latch (e.g., data latch 460 of FIG. 4A) (see step 484 in FIG. 4C). Subsequently, the enable signal of the addressed word line (WL) is turned to an "OFF" state at step 486 (as depicted at point "B" of FIG. 4B). Therefore, at this moment, the memory device enters an "idle state" as no memory operations are being performed during this point in time between the read operation signal pulses (see step 486 in FIG. 4C). However, as illustrated at point "C" in FIG. 4B, the bit line precharge enable signal 438 is in an "ON" state for a duration (i.e., from point "C" to point "A" in FIG. 4B) in order to bring the bit line (BL) back to the high voltage level, VDD, in order to effectuate the next word line (WL) enable signal pulse (see step 488 in FIG. 4C). As a result of this reinstated voltage differential in which VDD>VSS, the bit line (BL), though not actively addressed, may still experience a static current draw of the "OFF" current through the transistor(s) 410 of the memory cell(s) connected to the precharged bit line (BL). In the exemplary embodiment that is depicted in FIG. 4A, this current draw is referenced as current 450 and shown with respect to memory cell 470. Once the bit line (BL) is brought to the high voltage state, VDD, the bit line precharge enable signal 438 returns again to an "OFF" state at step 482 until the next word line (WL) enable signal 420 is turned to an "ON" state (depicted in FIG. 4B as the next point "A" in the sequence). Yet, between point "C" and subsequent point "A", in which the word line (WL) operation is in an idle state, any such static current draw in memory column 400 represents a leakage current (or loss) due to the fact that is not being utilized to perform any operation. Thus, this continual current flow is a power drain to the memory device, thereby increasing the device's power consumption and negatively impacting the efficiency and performance of the memory device. As the static current draw is created by the large voltage differential between VDD and VSS that is generated by the bit line precharge signal, a potent mechanism for reducing or eliminating this leakage current 450 is to reduce the effective voltage differential across the transistor(s) 410 of the precharged bit line (BL). The remaining figures and their description illustrate exemplary embodiments of a leakage current reduction circuit that fundamentally operates according to this objective.

Figure 5:
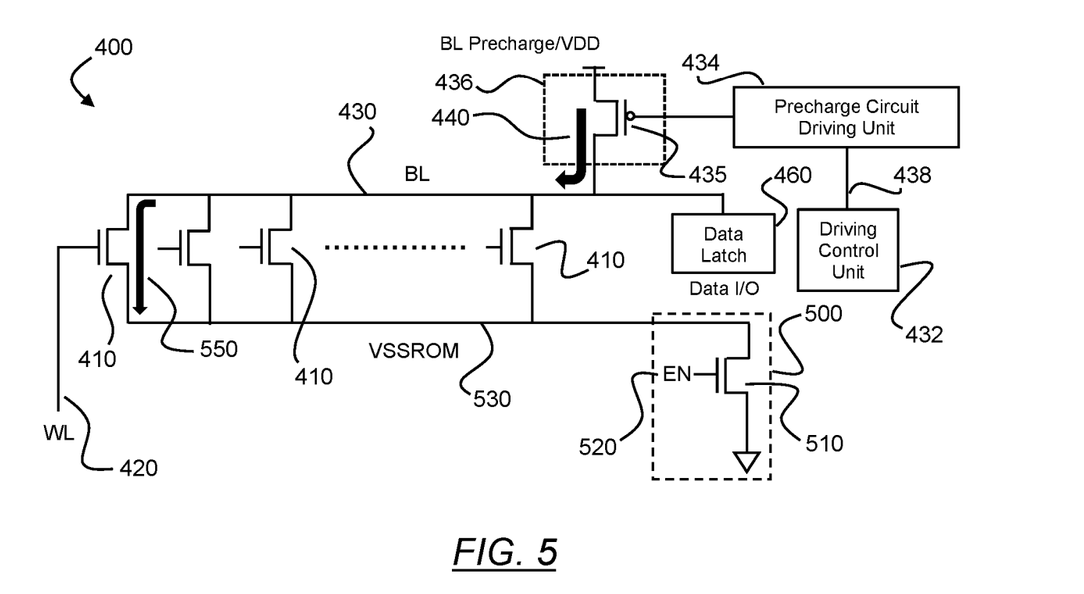
FIG. 5 is a block diagram of a circuit topology of the representative ROM column depicted in FIG. 4A with a leakage current reduction circuit, in accordance with exemplary embodiments.

Referring now to FIG. 5, there is depicted the representative column 400 of a ROM device shown in FIG. 4A with a leakage current reduction circuit 500 incorporated therein, according to an exemplary embodiment. In this particular embodiment, the leakage current reduction circuit 500 comprises an additional NMOS transistor 510 that is connected between ground (VSS) and the source regions of transistor(s) 410 of memory column 400, wherein the NMOS transistor 510 is controllable via an enable (EN) signal 520 at its respective control gate. Accordingly, when enabled (or turned to an "ON" state), the source region(s) of the transistor(s) 410 of column 400 remain connected at the voltage level VSS (or ground). However, when not enabled (or turned to an "OFF" state), transistor 510 creates an intermediate voltage level (or a "floating middle"), referenced as VSSROM 530 in FIG. 5, wherein VDD>VSSROM>VSS. Therefore, when enabled, the additional transistor 510 acts as a "floating ground" due to its switching nature. Thus, when not enabled, the transistor 510 effectively reduces the voltage differential across the transistor(s) 410 by a discernible fraction corresponding to the voltage difference between VDD and VSSROM relative to the larger voltage difference between VDD and VSS that otherwise would exist during a read operation. Hence, by reducing the effective voltage differential in this manner by, for example, using a switching component such as a single NMOS transistor 510, the magnitude of any static current draw 550 that might occur during a bit line precharge period is significantly minimized.

Importantly, while the exemplary embodiment of a leakage current reduction circuit of FIG. 5 utilizes a single NMOS transistor 510, this is just one non-limiting example of a suitable circuit configuration. The leakage current reduction circuit 500 may comprise any controllable circuitry element that operates to reduce the voltage differential across transistor(s) 410 during the bit line precharge period. For example, the leakage current reduction circuit 500 may comprise a stack of multiple transistors (e.g., NMOS and PMOS transistors) or a transistor having a longer gate length or a programmable device width. Generally, the leakage current reduction circuit 500 may comprise any dynamically-controllable device that is capable of modulating the amount of current through the transistor(s) 410 by modulating the voltage level of VSSROM between VSS and one or more voltage levels that reside below the VDD.

Figure 7A:
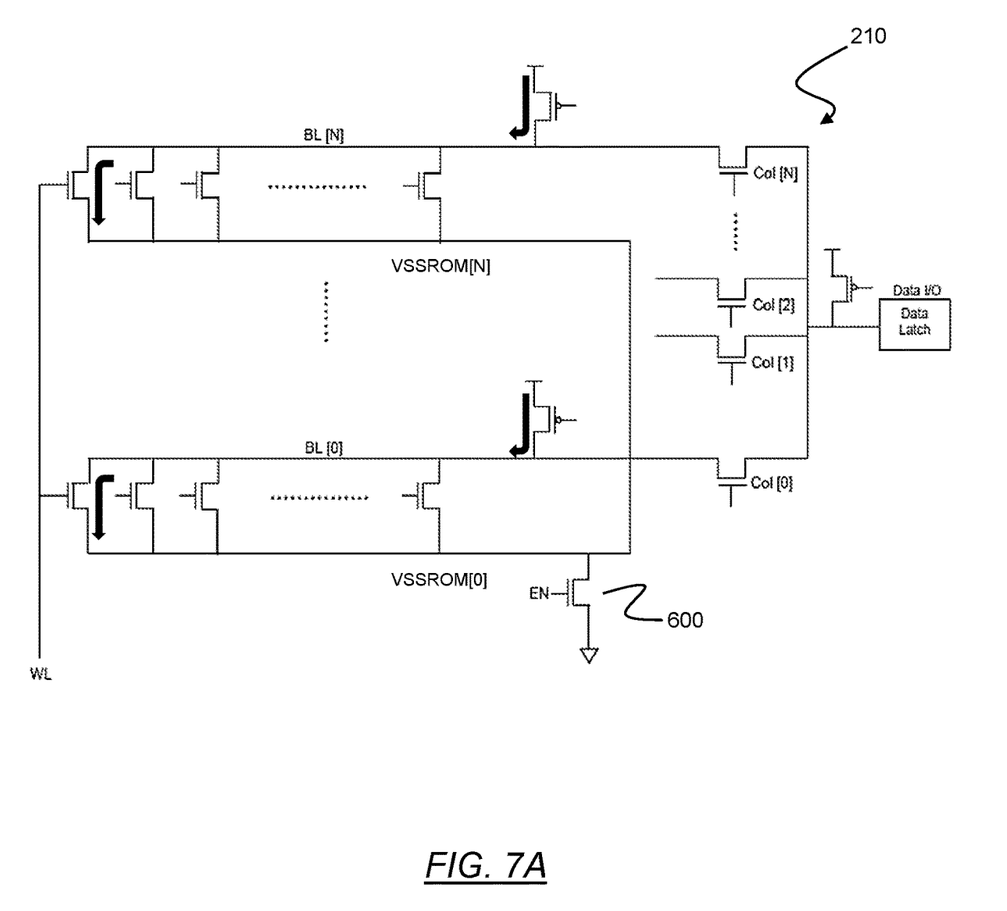
FIG. 7A is a block diagram of a circuit topology of a memory block, such as the block structure depicted in FIG. 2, having a leakage current reduction circuit incorporated therein, in accordance with an exemplary embodiment.
Figure 7B:
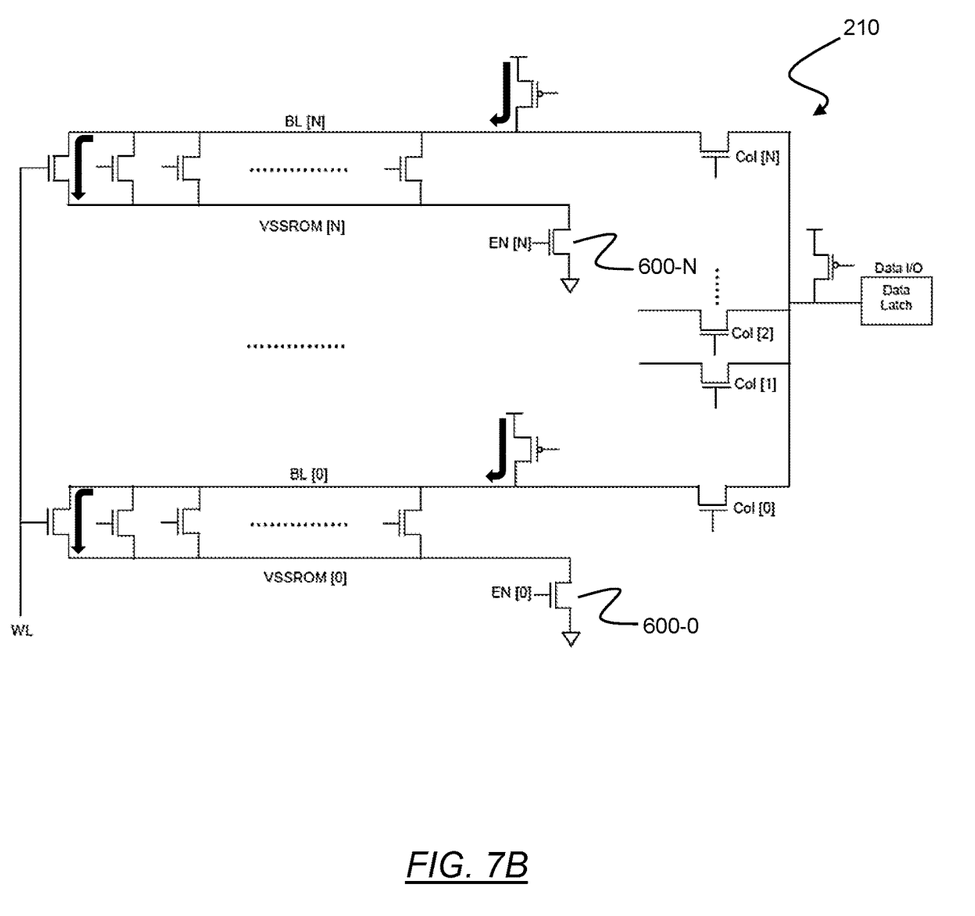
FIG. 7B is a block diagram of a circuit topology of a memory block, such as the block structure depicted in FIG. 2, having a leakage current reduction circuit incorporated therein, in accordance with another exemplary embodiment.

Proceeding upwards a hierarchical level, FIG. 7A depicts incorporation of the leakage current reduction circuit 500 into a memory block structure of a ROM array, according to one exemplary embodiment. For illustrative purposes, the block structure of FIG. 7A is a detailed circuit topology of the one-bit data interface wide block structure 210 shown in FIG. 2. In this particular configuration, the leakage current reduction circuit, in the form of, for example, an additional NMOS transistor 600, is operatively connected to the multiple columns (i.e., Col[0] through Col[N]) of the memory block 210 such that the transistor 600 influences the entire cell array block using just a single enable signal (EN) to control the switching between the floating ground condition and the VSSROM voltage level across the multiple columns. Alternatively, a leakage current reduction circuit may be incorporated into the memory block 210 such that it influences only a segment of the multiple columns. Or, more than one leakage current reduction circuit component may be incorporated into the memory block 210 such that each component influences one segment of the multiple columns and, together with all of the leakage current reduction components, the entire memory block 210 is covered. In a further example, FIG. 7B depicts a memory block 210 in which the VSSROM nodes of each column are separated and independently controlled by a respective leakage current reduction circuit component (600-0 to 600-N, where "N" is the number of columns in the memory block 210). In this particular embodiment, each leakage current reduction circuit component comprises an NMOS transistor having its own respective enable signal (EN) connected at its gate terminal.

Figure 6A:
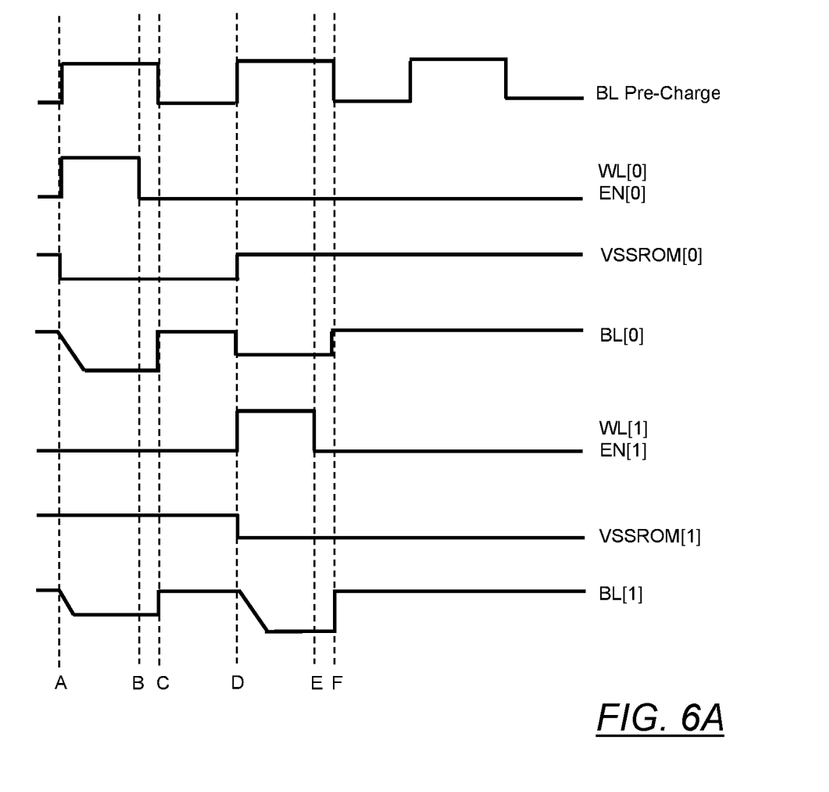
FIG. 6A is a timing diagram showing a read operation as applied to a memory block structure, such as the ROM block structure depicted in FIG. 7B, in accordance with exemplary embodiments.
Figure 6B:
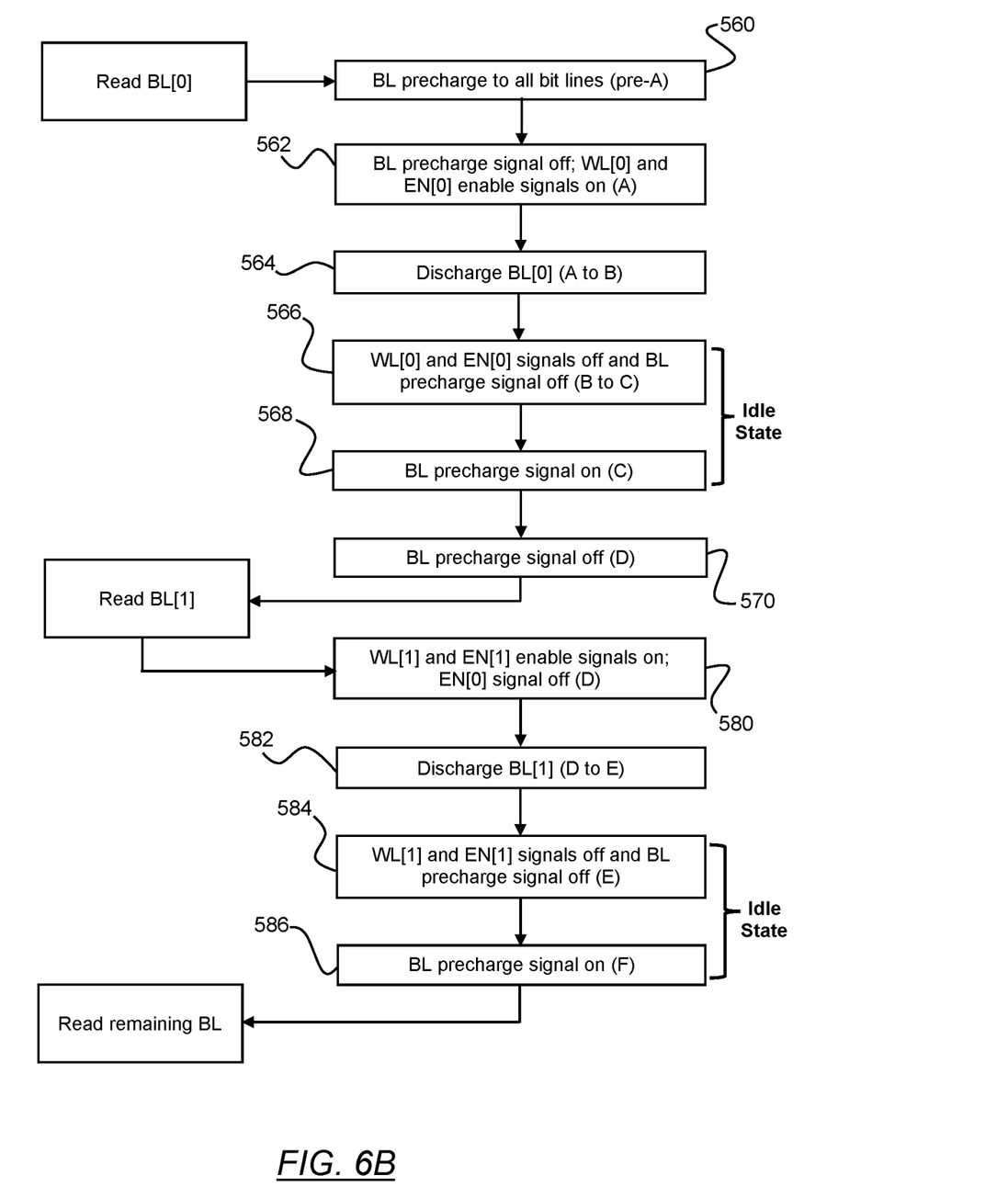
FIG. 6B is a flow diagram generally illustrating the steps of a read operation as applied to a memory block structure, such as the ROM block structure that is depicted in FIG. 7B, in accordance with exemplary embodiments.

Similar to the timing diagram in FIG. 4B, which illustrates the signal waveforms of a basic read operation according to an exemplary embodiment thereof, FIG. 6A depicts a timing diagram providing a general framework of a basic read operation that, according to this specific embodiment, is identical to the signal operation of FIG. 4B in all respects except for the incorporation of leakage current reduction circuit 500. As explained below, FIG. 6A clearly demonstrates the substantial influence of the leakage current reduction circuit on reducing any leakage current occurring during an idle state of the memory device, as well as conserving the dynamic power needed to precharge an addressed bit line (BL) and to perform a read operation, by intermittently creating an intermediate voltage level (VSSROM) during a bit line precharge period. Further, FIG. 6B illustrates in a flowchart manner the general process of a read operation in correlation with the timing diagram of FIG. 6A. To best describe the interplay between the enabling signals of the bit line precharge, the addressed word line (WL), and the leakage current reduction circuit (EN), and the resulting impact on the addressed bit line (BL) and static current draw, FIGS. 6A and 6B demonstrate a read operation cycle with respect to more than just one column of a ROM array structure, using the exemplary embodiment of the memory block 210 in FIG. 7B as an illustrative example, wherein each column is independently controlled by its respective leakage current reduction circuit component 600. Although FIG. 6A only details the signal operation with respect to a first word line and a second word line of a memory block structure, this is done solely for purposes of simplicity and clarity. The operation cycles that are outlined in FIGS. 6A and 6B are representative of, and can be repeated for, any ROM block structure having a multiple number of columns. This two-column illustration shall not be considered as a limiting example.

Beginning with a first word line (WL[0]) of a ROM array structure, to begin the read operation at step 560, the enable signal of the bit line precharge is turned to an "ON" state, thus bringing the addressed bit line (e.g., BL[0]) to the high voltage state, VDD, as depicted prior to point "A" in FIG. 6A. Subsequently, at step 562 of FIG. 6B, the enable signal of the first word line (WL[0]) is switched to its "ON" state and, as a result, the addressed bit line (BL[0]) is discharged at step 564 (as depicted between points "A" and "B" of FIG. 6A). Accordingly, this set of operations identically follows the basic read operation that is illustrated in FIGS. 4A-C. Concurrently however, as indicated at step 562 of FIG. 6B and between points "A" and "B" of FIG. 6A, the enable signal (EN[0]) of the leakage current reduction circuit 600-0 is turned to an "ON" state, thereby maintaining the voltage differential of VDD>VSS across the addressed memory cell transistor(s) in order to effectuate the read memory operation (i.e., VSSROM[0] equals VSS). Meanwhile, although all of the bit lines (BL) of the memory structure are now precharged at step 560, the enable signals of the non-addressed word lines remain in the "OFF" state. Accordingly, as depicted in FIG. 6A, signals WL[1] and EN[1] are in the "OFF" state and the source regions of the non-addressed transistors are connected to VSSROM[1], wherein VSSROM[1] resides at a voltage level that lies somewhere between the voltages VSS and VDD (i.e., a "floating middle" condition). Consequently, as clearly illustrated in FIG. 6A, the non-addressed bit line (BL[1]) is only discharged to an intermediate level in comparison to the larger magnitude of the discharge slope of the addressed word line (BL[0]).

Continuing now to step 566, the read operation with respect to the first word line concludes as the enable signal of the first word line (WL[0]) is turned to an "OFF" state. In addition, the enable signal (EN[0]) of the leakage current reduction circuit 600-0 is turned to an "OFF" state, thereby placing VSSROM[0] at some intermediate level between VDD and VSS. This condition is depicted at point "B" of FIG. 6A. At this point, the memory device enters into an "idle state" in which no memory operations are performed between the read operation signal pulses. However, at step 568, as is necessary to effectively conduct a standard ROM read operation, the bit line precharge signal returns to the "ON" state for a duration of time in order to bring all of the bit lines (BL) of the memory structure 210 back to the high voltage level, VDD, in order to effectuate the next read operation. Thus, once all of the bit lines are precharged, the bit line precharge signal is then turned to an "OFF" state at step 570 of FIG. 6B, as is depicted at point "D" in FIG. 6A. Importantly, due to VSSROM[0] now floating at an intermediate level, the magnitude of any leakage current occurring during this "idle state" with respect to this first memory column is effectively minimized as the voltage differential across the associated transistor(s) 410 is now reduced to VDD>VSSROM[0]. Furthermore, due to VSSROM[1] also floating at an intermediate level during this period, relatively less power is now required to precharge the non-addressed bit lines of the memory structure (e.g., BL[1]) to the high voltage level VDD as the precharging begins at the elevated voltage level of VSSROM[1] rather than at ground (VSS). Accordingly, the presence of the leakage current reduction circuit 600 in the memory structure reduces both the leakage current and the dynamic power consumption during the precharge/discharge phases.

Subsequently, at step 580 of FIG. 6B, a read operation of the next word line in the programmed sequence commences in response to the next word line enable signal pulse. In the example embodiment depicted in FIGS. 6A and 6B, an enable signal of the second word line (WL[1]) of the memory device is turned to an "ON" state according to a basic protocol that is described above (see point "D" in FIG.

6A). Also at this stage, in order to effectuate the read operation of the second word line, an enable signal (EN[1]) of the respective leakage current reduction circuit is switched to an "ON" state, thereby reinstating the antecedent voltage differential of VDD>VSS across the one or more transistor(s) 410 of the addressed bit line (BL[1]). As a result, the addressed bit line (BL[1]) is discharged at step 582.

Continuing to step 584 of FIG. 6B, the read operation of the second word line is completed. As such, the enable signal (WL[1]) of the second word line is turned to an "OFF" state, as depicted at point "E" of FIG. 6A. At this point, the memory device 210 enters into an "idle state." Again however, at step 586, the bit line precharge signal returns to an "ON" state for a span of time, beginning at point "F" of FIG. 6A, in order to bring all of the bit lines (BL) of the memory structure back to the high voltage level, VDD, in order to prepare the memory for further read operations.

Accordingly, for each read operation, the signal sequence that is depicted in FIGS. 6A and 6B and described above is repeated according to each addressed column and non-addressed column of the memory structure.

As illustrated in the exemplary embodiment of the operational cycle outlined in FIGS. 6A and 6B, given the memory structures 210 of, for example, FIG. 7A or 7B, the only bit line that experiences a "floating ground" (i.e., where VSS-ROM is equal to VSS) during any read operation is the specific bit line that is being addressed during that read operation. As such, all other columns of the memory structure (i.e., the non-addressed columns) experience the reduced voltage differential existing between the bit line precharge level, VDD, and the intermediate ("floating middle") voltage level, VSSROM, where VDD>VSSROM>VSS, as a result of the incorporation of the leakage current reduction circuit(s) 600.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for performing a read operation of a memory block of a read-only memory (ROM) array, comprising:
enabling a bit line precharge circuit of the memory block, thereby precharging one or more bit lines of the memory block at a first voltage level;
enabling a word line of one or more addressed memory cells of the memory block;
enabling a leakage current reduction circuit of the memory block, thereby generating across the one or more addressed memory cells a first voltage differential equal to the first voltage level;
discharging the one or more bit lines associated with the one or more addressed memory cells;
disabling the word line of the one or more addressed memory cells;
disabling the leakage current reduction circuit, thereby generating across the one or more addressed memory cells a second voltage differential that is less than the first voltage differential; and
discharging the one or more bit lines associated with one or more non-addressed memory cells of the memory block, wherein a voltage differential across each of the one or more non-addressed memory cells is equal to the second voltage differential.

2. The method according to claim 1, wherein each addressed memory cell comprises an NMOS transistor having:
a drain region operatively connected to the bit line precharge circuit; and
a source region operatively connected to the leakage current reduction circuit.

3. The method according to claim 2, wherein the leakage current reduction circuit comprises an NMOS transistor having:
a drain region operatively connected to the source region of each addressed memory cell; and
a source region operatively connected to an electrical ground.

4. The method according to claim 1, wherein:
the second voltage differential is equal to a difference between the first voltage level and a second voltage level; and
the second voltage level is less than the first voltage level and greater than 0V.

5. The method according to claim 1, wherein disabling the leakage current reduction circuit reduces a leakage current flowing across the one or more addressed memory cells after disabling the word line of the addressed memory cells.

6. The method according to claim 1, further comprising:
converting a sensed conduction current from the discharging into bit-level data; and
storing the bit-level data in one or more data latches.

7. A memory controller, comprising:
a first port configured to couple to a read-only memory (ROM) array, the memory array comprising at least one memory block having a plurality of memory cells; and
during a read operation, the memory controller is configured to:
enable a bit line precharge circuit of the memory block to precharge one or more bit lines of the memory block to a first voltage level;
enable a word line of one or more addressed memory cells of the plurality of memory cells;
enable a leakage current reduction circuit of the memory block, thereby generating across the one or more addressed memory cells a first voltage differential equal to the first voltage level;
discharge the one or more bit lines associated with the one or more addressed memory cells;
disable the word line of the one or more addressed memory cells;
disable the leakage current reduction circuit, thereby generating across the one or more addressed memory cells a second voltage differential that is less than the first voltage differential; and
discharge the one or more bit lines associated with one or more non-addressed memory cells of the plurality of memory cells, wherein a voltage differential across each of the one or more non-addressed memory cells is equal to the second voltage differential.

8. The memory controller according to claim 7, wherein each addressed memory cell comprises an NMOS transistor having:
a drain region operatively connected to the bit line precharge circuit; and
a source region operatively connected to the leakage current reduction circuit.

9. The memory controller according to claim 8, wherein the leakage current reduction circuit comprises an NMOS transistor having:
   a drain region operatively connected to the source region of each addressed memory cell; and
   a source region operatively connected to an electrical ground.

10. The memory controller according to claim 7, wherein:
    the second voltage differential is equal to a difference between the first voltage level and a second voltage level; and
    the second voltage level is less than the first voltage level and greater than 0V.

11. The memory controller according to claim 7, wherein the memory controller is further configured to:
    convert a discharged current of the one or more addressed memory cells into bit-level data; and
    store the bit-level data in one or more data latches.

12. The memory controller according to claim 7, wherein the bit line precharge circuit is comprised of a PMOS transistor.

13. A read-only memory (ROM) system, configured to reduce a leakage current thereof, comprising:
    a memory array storing data and comprising at least one memory block, wherein the memory block comprises a plurality of memory cells; and
    a controller coupled to the memory array and, during a read operation, is configured to:
      enable a bit line precharge circuit of the memory block to precharge one or more bit lines of the memory block to a first voltage level;
      enable a word line of one or more addressed memory cells of the plurality of memory cells;
      enable a leakage current reduction circuit of the memory block, thereby generating across the one or more addressed memory cells a first voltage differential equal to the first voltage level;
      discharge the one or more bit lines associated with the one or more addressed memory cells;
      disable the word line of the one or more addressed memory cells;
      disable the leakage current reduction circuit, thereby generating across the one or more addressed memory cells a second voltage differential that is less than the first voltage differential; and
      discharge the one or more bit lines associated with one or more non-addressed memory cells of the plurality of memory cells, wherein a voltage differential across each of the one or more non-addressed memory cells is equal to the second voltage differential.

14. The memory system according to claim 13, wherein each addressed memory cell comprises an NMOS transistor having:
    a drain region operatively connected to the bit line precharge circuit; and
    a source region operatively connected to the leakage current reduction circuit.

15. The memory system according to claim 14, wherein the leakage current reduction circuit comprises an NMOS transistor having:
    a drain region operatively connected to the source region of each addressed memory cell; and
    a source region operatively connected to an electrical ground.

16. The memory system according to claim 13, wherein:
    the second voltage differential is equal to a difference between the first voltage level and a second voltage level; and
    the second voltage level is less than the first voltage level and greater than 0V.

17. The memory system according to claim 13, wherein the memory controller is further configured to:
    convert a discharged current of the one or more addressed memory cells into bit-level data; and
    store the bit-level data in one or more data latches.

* * * * *